United States Patent

Nishio et al.

[11] Patent Number: 6,046,547
[45] Date of Patent: Apr. 4, 2000

[54] SELF-EMISSION TYPE IMAGE DISPLAY DEVICE

[75] Inventors: Yoshitaka Nishio; Hisakazu Takahashi, both of Osaka, Japan

[73] Assignee: Sanyo Electric Co., Ltd., Osaka-fu, Japan

[21] Appl. No.: 08/991,180

[22] Filed: Dec. 16, 1997

[30] Foreign Application Priority Data

Dec. 19, 1996 [JP] Japan .................................. 8-339228
Nov. 14, 1997 [JP] Japan .................................. 9-313823

[51] Int. Cl.$^7$ .................................................. H01L 27/12
[52] U.S. Cl. ...................... 315/169.3; 315/173; 313/500; 345/76
[58] Field of Search ................................ 315/169.3, 173, 315/169.1; 313/500; 345/76, 92

[56] References Cited

U.S. PATENT DOCUMENTS 5,631,664  5/1997  Adachi et al. ............................. 345/74
5,684,365  11/1997  Tang et al. ............................. 315/169.3

OTHER PUBLICATIONS

Abstract of a Japanese Unexamined Patent Publ. No. 08241057; dated Sep. 17, 1996.

Abstract of a Japanese Unexamined Patent Publ. No. 08054836; dated Feb. 27, 1996.

*Primary Examiner*—Don Wong
*Assistant Examiner*—James Clinger
*Attorney, Agent, or Firm*—Nikaido, Marmelstein, Murray & Oram, LLP

[57] ABSTRACT

A self-emission type image display device comprising a first transparent substrate, transparent pixel electrodes and driving elements for respectively driving the transparent pixel electrodes which are respectively formed on one surface of the first transparent substrate, a common electrode, a luminescent layer provided between the common electrode and the first transparent substrate, transparent discrete capacitance electrodes formed on the other surface of the first transparent substrate, a transparent common capacitance electrode, and a transparent capacitance layer provided between the transparent common capacitance electrode and the first transparent substrate, the corresponding electrodes in the discrete capacitance electrodes and the pixel electrodes being connected to each other by a contact hole, the transparent common capacitance electrode and the common electrode being connected to the ground by a connecting line in a peripheral edge portion of the panel.

38 Claims, 9 Drawing Sheets light emission

▨ ITO
■ MgIn
▩ metal peripheral eadge of the panel

SELF-EMISSION TYPE IMAGE DISPLAY DEVICE

BACKGROUND OF THE INVENTION

1. Field of the Invention

The present invention relates to a self-emission type image display device comprising luminescent pixel elements such as organic EL (electroluminescent) elements.

2. Description of the Prior Art

It is considered that a dot matrix display is constructed using luminescent pixel elements such as organic EL elements. FIG. 10 is a cross-sectional view showing a luminescent pixel element corresponding to one pixel. The luminescent pixel element comprises a transparent glass substrate 601, a transparent pixel electrode 602 (composed of ITO (indium tin oxide), for example, and functioning as a hole injection electrode) and a driving element 603 for driving the pixel electrode 602 which are respectively formed on the transparent glass substrate 601, a common electrode 604 (composed of MgIn, for example, and functioning as an electron injection electrode) provided opposite to the transparent glass substrate 601, and a luminescent layer 600 provided between the common electrode 604 and the transparent glass substrate 601 for emitting light toward the pixel electrode 602.

However, the luminescent pixel element such as the organic EL element is high in response speed ($\mu$s order) and hardly has memory function properties. When an image is displayed, therefore, such a feeling that a screen flickers is increased.

As disclosed in Japanese Patent Laid-Open No. 241057/1996 (IPC G09G 3/30, H05B 33/08), it is considered that capacitances are provided in parallel in each of thin film transistors for respectively driving luminescent pixel elements, the capacitances are charged when the thin film transistor is turned on, and a current is supplied from each of the capacitances in the thin film transistor to the corresponding luminescent pixel element even after the thin film transistor is turned off.

However, the above-mentioned gazette does not disclose where the capacitances are ensured. In general, it is considered that the capacitances for each of the luminescent pixel elements are collectively formed outside a region where the luminescent pixel element is formed. Since a capacitance forming area is required, however, the self-emission type image display device is increased in size by the required capacitance forming area. On the other hand, when the capacitances are formed in the region where each of the luminescent pixel elements is formed, the light emitting area is eroded to be decreased in size by an area corresponding to the capacitances, whereby sufficient brightness is not obtained.

Japanese Patent Laid-Open No. 54836/1996 (IPC G09F 9/33) discloses that a capacitance line is provided, to form a capacitance between the capacitance line and a pixel electrode, that is, the pixel electrode is taken as one electrode of the capacitance. In such a structure that the pixel electrode is taken as one electrode of the capacitance, it is difficult to ensure a region where a dielectric for forming the capacitance (a capacitance layer) is formed. Particularly, it is impossible to realize a capacitance structure using a liquid crystal as the dielectric.

An object of the present invention is to provide a self-emission type image display device in which a region where a dielectric for forming a capacitance (a capacitance layer) is formed can be easily ensured, and capacitances are respectively formed in regions where luminescent pixel elements are formed without decreasing the light emitting area of each of the luminescent pixel elements.

SUMMARY OF THE INVENTION

In order to solve the above-mentioned problems, a self-emission type image display device according to the present invention is characterized in that capacitance means for respectively holding signals fed to luminescent pixel elements are formed with each of the capacitance means and the corresponding luminescent pixel element laminated, and the capacitance means respectively comprise discrete capacitance electrodes provided apart from pixel electrodes, the discrete capacitance electrode being electrically connected to the pixel electrode.

In the above-mentioned construction, each of the capacitance means is formed with the capacitance means and the corresponding luminescent pixel element laminated, whereby the light emitting area of the luminescent pixel element is not eroded, and the light emitting area can be prevented from being reduced. Further, each of the capacitance means comprises the discrete capacitance electrode provided apart from the pixel electrode, thereby making it possible to easily ensure a region where a dielectric for forming a capacitance (a capacitance layer) is formed.

A capacitance layer in each of the capacitance means may be a transparent capacitance layer formed on a light emission surface of the corresponding luminescent pixel element or an opaque or transparent capacitance layer formed on a reverse surface to the light emission surface of the luminescent pixel element. Further, one driving element may be used as both driving means in each of the luminescent pixel elements and charging control means in the capacitance means corresponding to the luminescent pixel element.

A self-emission type image display device according to the present invention is characterized by comprising a transparent substrate, a group of transparent pixel electrodes and a group of driving elements for respectively driving the transparent pixel electrodes which are respectively formed on the transparent substrate, a common electrode provided opposite to the transparent substrate, a luminescent layer provided between the common electrode and the transparent substrate for emitting light toward the transparent pixel electrodes, a group of discrete capacitance electrodes provided opposite to the common electrode, and a capacitance layer provided between the common electrode and the group of discrete capacitance electrodes, the corresponding electrodes in the group of discrete capacitance electrodes and the group of pixel electrodes being electrically connected to each other.

A self-emission type image display device according to the present invention is characterized by comprising a first transparent substrate, a group of transparent pixel electrodes and a group of driving elements for respectively driving the transparent pixel electrodes which are respectively formed on one surface of the first transparent substrate, a common electrode provided opposite to one surface of the first transparent substrate, a luminescent layer provided between the common electrode and the first transparent substrate for emitting light toward the transparent pixel electrodes, a group of transparent discrete capacitance electrodes formed on the other surface of the first transparent substrate, a transparent common capacitance electrode formed on a surface, which is opposite to the first transparent substrate, of the second transparent substrate provided opposite to the other surface of the first transparent substrate, and a transparent capacitance layer provided between the transparent common capacitance electrode and the first transparent substrate, the corresponding electrodes in the group of transparent discrete capacitance electrodes and the group of transparent pixel electrodes being connected to each other by a contact hole formed in the first transparent substrate.

A self-emission type image display device according to the present invention is characterized by comprising a first transparent substrate, a group of transparent discrete capacitance electrodes and a group of driving elements for respectively driving the transparent discrete capacitance electrodes which are respectively formed on one surface of the first transparent substrate, a transparent common capacitance electrode provided opposite to one surface of the first transparent substrate, a transparent capacitance layer provided between the transparent common capacitance electrode and the first transparent substrate, a second transparent substrate having the transparent common capacitance electrode formed on its one surface and having a group of discrete transparent pixel electrodes on the other surface, a common electrode provided opposite to the second transparent substrate, and a luminescent layer formed between the common electrode and the group of transparent pixel electrodes for emitting light toward the transparent pixel electrodes, the corresponding electrodes in the transparent discrete capacitance electrodes and the transparent pixel electrodes being connected to each other.

A self-emission type image display device according to the present invention is characterized by comprising a first transparent substrate, a group of transparent discrete capacitance electrodes and a group of driving elements for respectively driving the transparent discrete capacitance electrodes which are respectively formed on one surface of the first transparent substrate, a transparent common capacitance electrode formed on a surface, which is opposite to the first transparent substrate, of the second transparent substrate provided opposite to one surface of the first transparent substrate, a transparent capacitance layer provided between the transparent common capacitance electrode and the first transparent substrate, a group of transparent pixel electrodes formed on the other surface of the first transparent substrate, a common electrode provided opposite to the other surface of the first transparent substrate, and a luminescent layer provided between the common electrode and the group of transparent pixel electrodes for emitting light toward the transparent pixel electrodes, the corresponding electrodes in the group of transparent discrete capacitance electrodes and the group of transparent pixel electrodes being connected to each other by a contact hole formed in the first transparent substrate.

A self-emission type image display device according to the present invention is characterized by comprising a substrate, a group of discrete capacitance electrodes and a group of driving elements for respectively driving the discrete capacitance electrodes which are respectively formed on one surface of the substrate, a common capacitance electrode provided opposite to one surface of the substrate, a capacitance layer provided between the common capacitance electrode and the substrate, a group of pixel electrodes formed on the other surface of the substrate, a transparent common electrode formed on a surface, which is opposite to the substrate, of the transparent substrate provided opposite to the other surface of the substrate, and a luminescent layer provided between the transparent common electrode and the group of pixel electrodes for emitting light toward the transparent common electrode, the corresponding electrodes in the group of discrete capacitance electrodes and the group of pixel electrodes being connected to each other by a contact hole formed in the substrate.

A self-emission type image display device according to the present invention is characterized by comprising a substrate, a group of discrete capacitance electrodes and a group of driving elements for respectively driving the discrete capacitance electrodes which are respectively formed on one surface of the substrate, a common capacitance electrode provided opposite to one surface of the substrate, a capacitance layer provided between the common capacitance electrode and the substrate, a common electrode formed on the other surface of the substrate, a group of transparent pixel electrodes formed on a surface, which is opposite to the substrate, of the transparent substrate provided opposite to the other surface of the substrate, and a luminescent layer provided between the group of transparent pixel electrodes and the common electrode for emitting light toward the transparent pixel electrodes, the corresponding electrodes in the group of discrete capacitance electrodes and the group of transparent pixel electrodes being connected to each other by a contact hole formed on the substrate and a conductor formed in the luminescent layer.

As the capacitance layer or the transparent capacitance layer, a liquid crystal or transparent dielectric ceramics can be used. The luminescent layer may be an organic electroluminescent layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (Embodiment 1)

A first embodiment of the present invention will be described on the basis of the drawings.

Figure 1A:
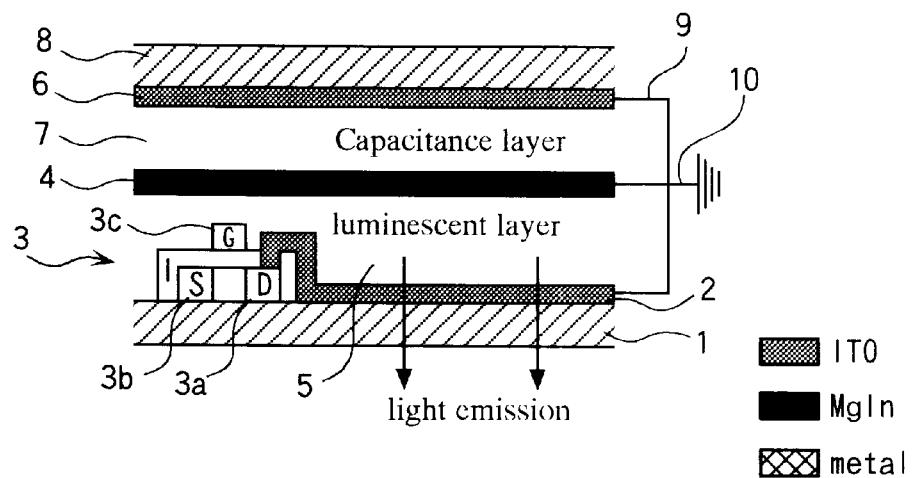
FIG. 1A is a cross-sectional view simply showing a principal part of a self-emission type image display panel according to a first embodiment of the present invention.
Figure 1B:
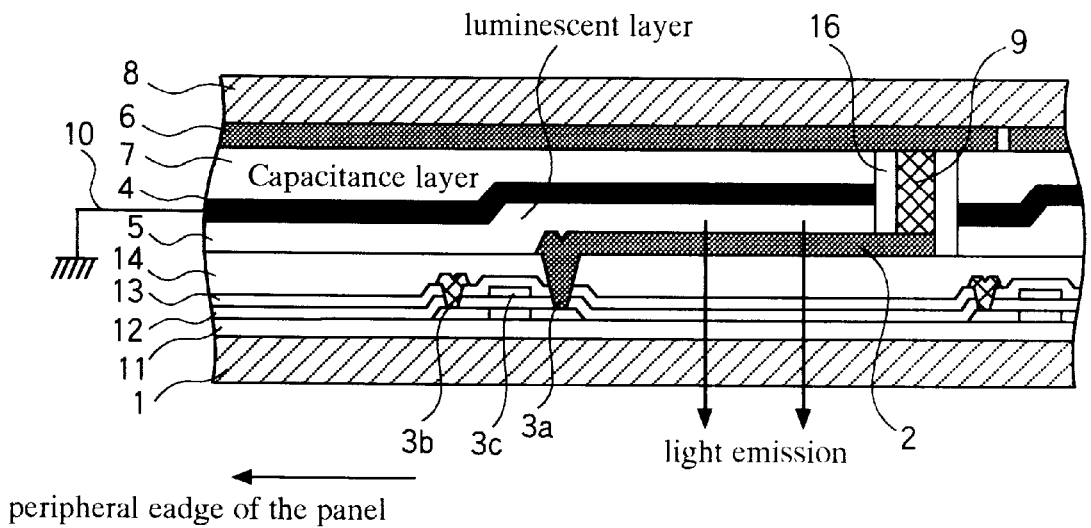
FIG. 1B is a cross-sectional view specifically showing the principal part.
Figure 2:
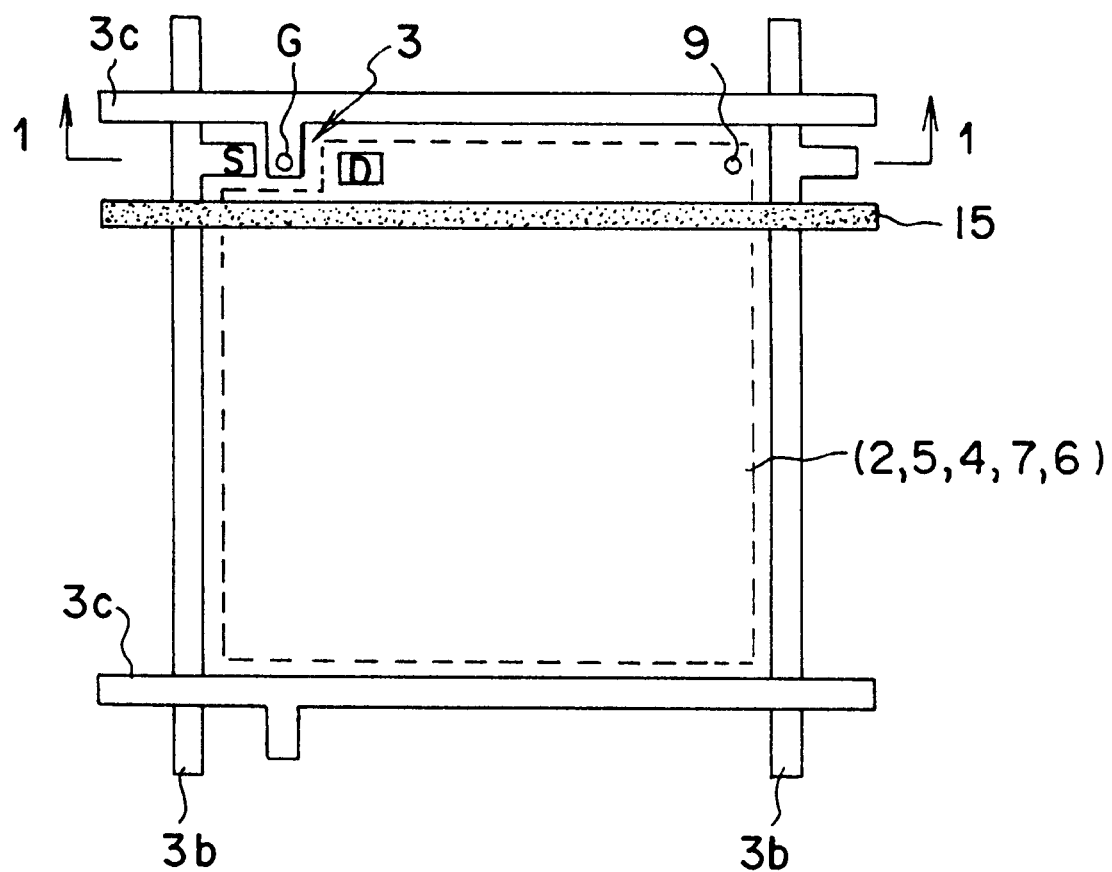
FIG. 2 is a schematic plan view of the self-emission type image display panel according to the present invention.

FIG. 1 A is a cross-sectional view simply showing a principal part of a self-emission type image display panel according to the present embodiment, and FIG. 1 B is a cross-sectional view specifically showing the principal part. FIG. 1A and FIG. 1B differ in that a pixel electrode 2 is directly formed on a transparent glass substrate 1 in FIG. 1 A, while a pixel electrode 2 is not directly formed on a transparent glass substrate 1 in FIG. 1B and in the other minute points, but have common characteristics of the present embodiment. FIG. 2 is a plan view for explaining a region of one pixel element of the self-emission type image display panel according to the present embodiment. A line A—A in FIG. 2 indicates a cutting line in the cross-sectional view of FIG. 1.

As shown in FIG. 1B, an interlayer insulating film ($SiO_2$) 11 is formed on the transparent glass substrate 1 (1 mm in thickness), and a plurality of driving elements 3 are formed on the interlayer insulating film ($SiO_2$) 11. The driving element 3 is composed of a TFT (thin film transistor) (hereinafter denoted as the TFT 3). The TFT 3 comprises $n^+$ (rich) type poly silicon (p-Si) portions constituting a source and a drain, an undoped poly silicon (p-Si) portion interposed between the $n^+$ type poly silicon (p-Si) portions and constituting a channel portion, a gate insulating film 12, and a gate electrode (a lamination of $n^+$ type p-Si and Al) arranged on the undoped poly silicon (p-Si) portion with the gate insulating film 12 interposed therebetween. The TFTs 3 are covered with an interlayer insulating film ($SiO_2$) 13.

A wiring constituting a source electrode (Al)3b in the TFT 3 (the wiring is referred to as a signal line) and a wiring constituting a gate electrode 3c (the wiring is referred to as a scanning line) are perpendicular to each other, and are positioned at a distance corresponding to a pixel pitch. A transparent flattened film 14 is formed on the interlayer insulating film 13. The flattened film 14 is formed by spin-coating acrylic resin. In the present embodiment, the height of the TFT 3 is approximately 0.3 μm, and the thickness of the flattened film 14 is approximately 1.5 μm, whereby irregularities caused by the TFT 3 can be almost eliminated. Consequently, the necessity of grinding treatment for flattening can be eliminated.

A drain electrode 3a in the TFT 3 is provided with it penetrating the flattened film 14, the interlayer insulating film 13, and the gate insulating film 12, to electrically connect the drain of the TFT 3 and a transparent pixel electrode 2 formed on the flattened film 14. Such a connecting structure makes it possible to turn the arbitrary TFT 3 on by suitably inputting a signal to the source electrode 3b and the gate electrode 3c to individually energize the arbitrary pixel electrode 2. The pixel electrode 2 functions as a hole injection electrode, and is composed of ITO (indium tin oxide) having a thickness of 1000 Å, for example.

A luminescent layer 5 is formed to a thickness of approximately 1200 Å on the flattened film 14 and the pixel electrode 2. A common electrode 4 is formed on the luminescent layer 5. The common electrode 4 in each pixel element is formed with respect to each pixel in the same shape and arrangement as those of the pixel electrode 2 in the present embodiment. Therefore, common electrodes 4 are connected to each other by cathode rays 15 shown in FIG. 2. The common electrode 4 functions as an electron injection electrode, and is composed of MgIn having a thickness of 2000 Å or AlLi (an aluminum-lithium alloy) having a thickness of 1000 Å, for example.

A capacitance layer 7 is formed on the common electrode 4. A glass substrate 8 on which discrete capacitance electrodes 6 (composed of ITO, for example) are formed is provided on the capacitance layer 7 in a state where the discrete capacitance electrodes 6 are opposite to the common electrode 4. Each of the discrete capacitance electrodes 6 and the corresponding pixel electrode 2 are electrically connected to each other by a connecting portion 9. The common electrode 4 is connected to the ground by a connecting line 10 in a peripheral edge of the panel, for example. The connecting portion 9 is composed of Al, Ag, Cr, or ITO, for example, and the height thereof is approximately 3700 Å. An insulating film 16 exists around the connecting portion 9. Various methods of forming the connecting portion 9 and the insulating film 16 are considered. For example, a resist is applied on the entire surface of the substrate after the pixel electrodes 2 are formed, and the resist in a region where the connecting portion 9 is to be formed is removed, after which a layer of Al is formed. When the resist is removed, Al remains in a portion after the removal, which forms the connecting portion 9. The resist is applied on the entire surface of the substrate again. A resist in a region where the insulating film 16 is to be formed is removed, and an insulating film is formed in a portion after the removal. Thereafter, all resists may be removed to form the luminescent layer 5, the common electrode 4, and the like.

Each of luminescent pixel elements is constituted by the common electrode 4, the pixel electrode 2, and the luminescent layer 5 existing in correspondence to each portion of the pixel electrode 2. Each of capacitance means is constituted by the discrete capacitance electrode 6, the capacitance layer 7 existing in correspondence to its portion, and the common electrode 4. Each of the capacitance means is structurally arranged with the capacitance means and the corresponding luminescent pixel element laminated. The capacitance means is connected with the luminescent pixel element electrically in parallel, and has a signal holding function corresponding to the luminescent pixel element. That is, in the pixel electrode 2 which is energized, the luminescent layer 5 in its portion emits light, so that the light is emitted from the transparent glass substrate 1, and the discrete capacitance electrode 6 is energized through the connecting portion 9 from the pixel electrode 2. Therefore, the capacitance layer 7 in a portion corresponding to the discrete capacitance electrode 6 is charged, that is, is subjected to charging for signal holding corresponding to the luminescent pixel element.

Figure 3:
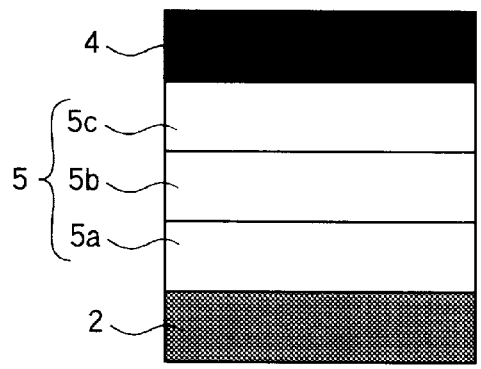
FIG. 3 is a cross-sectional view showing one example of a luminescent layer of the self-emission type image display panel according to the present invention.

FIG. 3 is a cross-sectional view showing the detailed structure of the luminescent layer 5 formed between the pixel electrode 2 and the common electrode 4. The luminescent layer 5 comprises a hole transporting layer 5a formed on the side of the pixel electrode 2, an electron transporting layer 5c formed on the side of the common electrode 4, and a luminescent layer portion 5b formed between the hole transporting layer 5a and the electron transporting layer 5c, which respectively use organic EL (electroluminescent) elements. Specifically, the hole transporting layer 5a is composed of a triphenylamine derivative (MTDATA) indicated by the following first chemical formula, the luminescent layer 5b is composed of a compound formed by doping 5% by weight of rubrene indicated by the following third chemical formula into a diamine derivative (TPD) indicated by the following second chemical formula, and the electron transporting layer 5c is composed of a tris (8-quinolinol) aluminum ($Alq_3$) indicated by the following fourth chemical formula.

[Chemical formula 1]

[Chemical formula 2]

[Chemical formula 3]

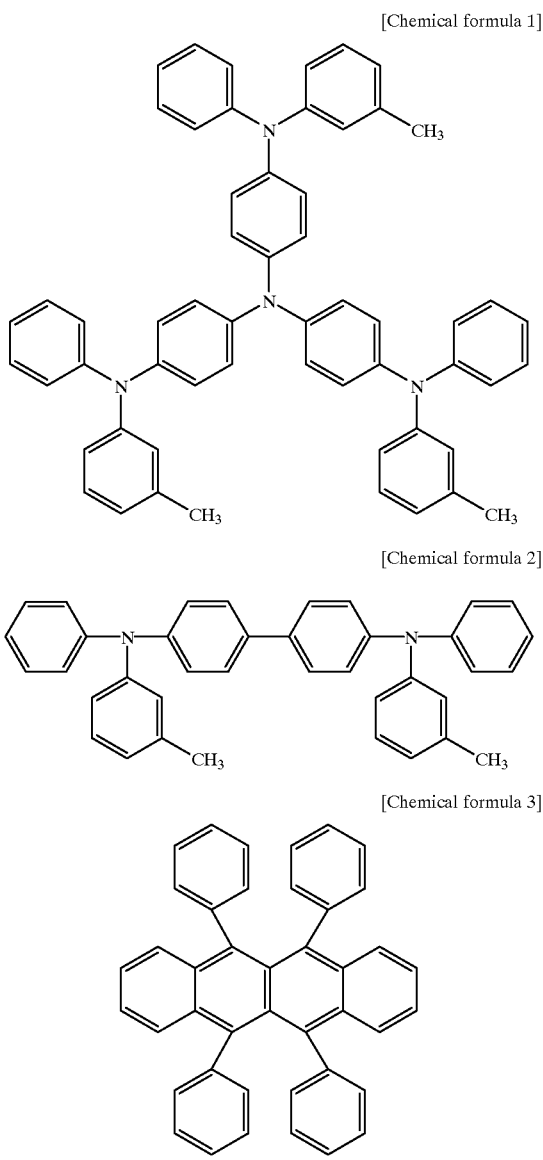

[Chemical formula 4]

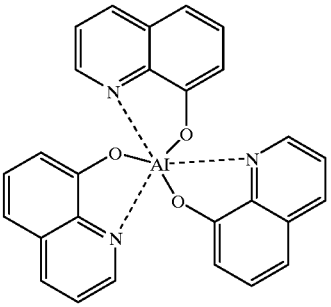

The self-emission type image display panel is fabricated in the following manner. For example, the size of one pixel is taken as $50 \times 150 \mu m^2$. As shown in FIGS. 1 and 2, the TFT 3 is formed using poly silicon (p-Si) in correspondence to each pixel portion on the transparent glass substrate 1, and the flattened film 14 or the like is further formed thereon. The flattened film 14 or the like in a portion where the drain electrode 3a is to be formed is removed, to form ITO (the pixel electrode 2) in the pixel portion. At this time, the drain electrode 3a in the TFT 3 is formed by the ITO. The triphenylamine derivative (MTDATA) is then deposited to a thickness of 400 Å. The deposition is performed by vacuum evaporation using a resistance heating board under the vacuum of $5 \times 10^{-6}$ Torr. The diamine derivative (TPD) and the-rubrene are then deposited to a thickness of 300 Å by an evaporation method such that the weight ratio of the rubrene is 5%. Tris (8-quinolinol) aluminum ($Alq_3$) is then deposited to a thickness of 500 Å by vacuum evaporation. Further, an MgIn alloy (Mg:In=50:3) is deposited to a thickness of 2000 Å by a resistance heating evaporation method. Alternatively, an AlLi alloy (Al:Li=99.5:0.5) is deposited to a thickness of 1000 Å by a resistance heating evaporation method. In the self-emission type image display panel thus fabricated, each of the luminescent pixel elements can emit light in yellow at luminance of 200 $cd/M^2$ under conditions of a voltage of 5 V and a current density of 2 $mA/cm^2$.

The capacitance layer 7 is composed of a liquid crystal. An example of the liquid crystal is alkyl cyanobiphenyl which is a TN (Twisted Nematic) liquid crystal indicated by the following fifth chemical formula:

[Chemical formula 5]

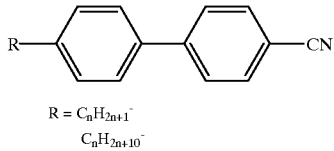

$R = C_nH_{2n+1}^-$
$C_nH_{2n+10}^-$

The capacitance layer 7 composed of a liquid crystal is obtained by affixing the transparent glass substrate 1 on which the TFT 3, the pixel electrode 2, the luminescent layer 5, and the common electrode 4 are formed and the glass substrate 8 on which the discrete capacitance electrodes 6 are formed with a spacer (approximately 500 Å) corresponding to the shape of their peripheral edge interposed therebetween, injecting the liquid crystal from an injection hole formed in the spacer, temporarily sealing the injection hole, then immersing the injection hole in the liquid crystal under vacuum and returning the injection hole to a normal pressure, and sealing the injection hole again.

In the above-mentioned construction, when a signal for lighting the pixel up is inputted to the gate electrode 3c and the source electrode 3b in the TFT 3, the TFT 3 is turned on, so that a current flows between the source electrode 3b and the drain electrode 3a. At the same time that the luminescent layer 5 in the pixel portion emits light, charge is stored in the capacitance layer 7 in the pixel portion. Thereafter, when the TFT 3 is turned off, inherent supply of a current to the luminescent layer 5 is cut off. However, the charge stored in the capacitance layer 7 flows into the luminescent layer 5, so that a state where the luminescent layer 5 emits light is maintained depending on the amount of the stored charge.

Figure 10:
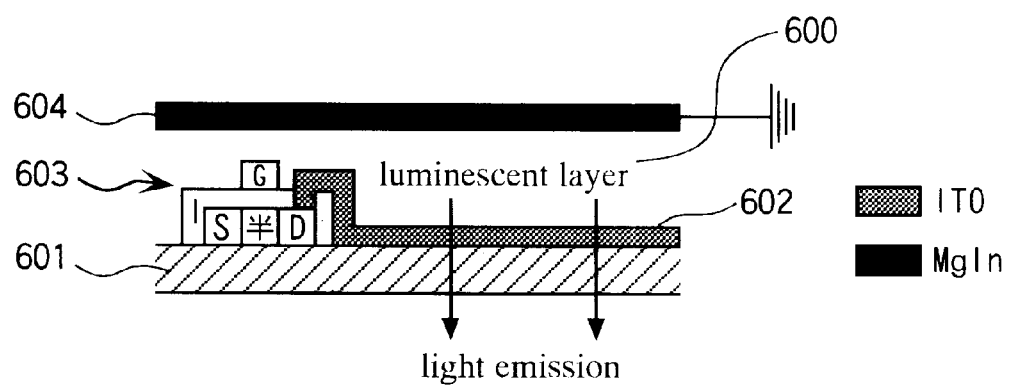
FIG. 10 is a cross-sectional view of a conventional self-emission type image display panel.

Description is now made of the details of the capacitance layer 7 in a case where a TFT active matrix display meeting the specification of VGA (Video Graphics Array; 640×480 dots) is fabricated using the above-mentioned organic EL elements, letting the size of one pixel be 50×150 $\mu m^2$. Suppose line sequential driving is performed, letting the frame frequency be 60 Hz and the duty ratio of an applied current be 1/480 S. In this case, when there is no capacitance means (corresponding to the structure shown in FIG. 10 described in "Prior Art"), the light emission/light-out time ratio per scanning line is 35 $\mu$S/17 mS, as indicated by a dotted line in FIG. 4, so that an image flickers.

Figure 4:
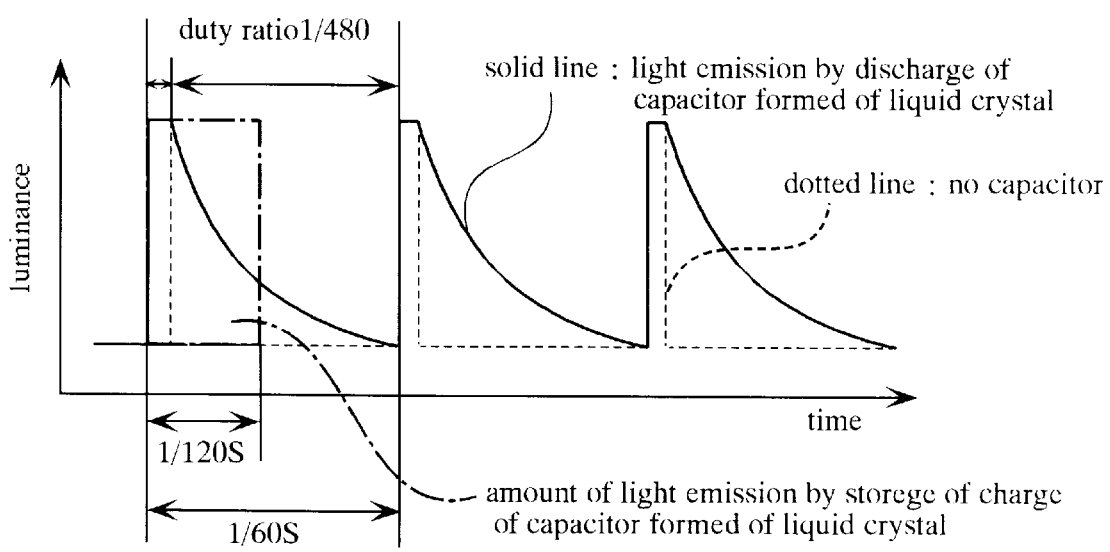
FIG. 4 is an explanatory view showing how a time period during which a luminescent pixel element emits light in the self-emission type image display panel according to the present invention is extended.

In order to prevent the image from flickering, if the luminescent layer is lighted up by discharging the capacitance layer 7 as indicated by a solid line in FIG. 4, and is lighted up for a time period which is one-half (½) of the frame frequency, that is, for 1/120 S as indicated by a one-dot and dash line, capacitor capabilities required for the capacitance layer 7 are as follows. In FIG. 4, the horizontal axis indicates time, and the vertical axis indicates luminance.

A current I per pixel for obtaining luminance of 200 cd/m² is as follows:

$$I = 2 \times 10 \text{(current density)} \times 50 \times 150 \times 10^{-12} \text{(pixel size)}$$
$$= 15 \times 10^{-8} [A]$$

The amount of charge Q required to light the luminescent layer up for 1/120 S is as follows:

$$Q = I \times \Delta t = 15 \times 10^{-8} \times 1/120 = 125 \times 10^{-11} \quad [C]$$

A capacity C required for the capacitance layer 7 is as follows:

$$C = Q/V = 125 \times 10^{-11}/5 = 25 \times 10^{-11} \quad [F]$$

In order to satisfy the above-mentioned capacity C, the following equation A is obtained, letting S be the area of one pixel, d be the thickness of the capacitance layer 7, $\epsilon 0$ be the dielectric constant under vacuum ($\epsilon 0 = 8.85 \times 10^{-12}$ [F/m]), and the above-mentioned alkyl cyanobiphenyl (a dialectic constant $\epsilon$=approximately 10 to 20) is used as the material of the capacitance layer 7:

$$d = \varepsilon \times \varepsilon_0 \times S / C \quad \text{Equation A}$$
$$= 10 \times 8.85 \times 10^{-12} \times 50 \times 150 \times 10^{-12} / (25 \times 10^{-11})$$
$$\approx 25 [\text{Å}]$$

Specifically, when the alkyl cyanobiphenyl is used as the material of the liquid crystal layer 7, the thickness thereof may be not more than 25 Å. If the light emission time can be made slightly longer by providing the capacitance means, the flickering is reduced. In a case where the alkyl cyanobiphenyl is used as the material of the liquid crystal layer 7, the requirement that the thickness thereof is made larger than 25 Å is not excluded. Specifically, it is ideally desired that the thickness of the liquid crystal layer 7 is not more than 25 Å. However, it may be 500 Å, for example, by attaching importance to the facility for producing the capacitance layer.

As described in the foregoing, according to the present invention, each of the capacitance means is formed not outside a region where the corresponding luminescent pixel element is formed but in a region corresponding to the region where the luminescent pixel element is formed, thereby making it possible to prevent the self-emission type image display device from being increased in size. Since each of the capacitance means is formed with the capacitance means and the corresponding luminescent pixel element laminated, the light emitting area of the luminescent pixel element is not eroded, thereby making it possible to prevent the light emitting area from being decreased in size. Further, a large capacity can be easily obtained using the above-mentioned liquid crystal or the like because the discrete capacitance electrodes 6 are provided, thereby producing the effect of eliminating the flickering of a screen by extending a time period during which the luminescent pixel element is lighted up only by a required time period.

(Embodiment 2)

Figure 5A:
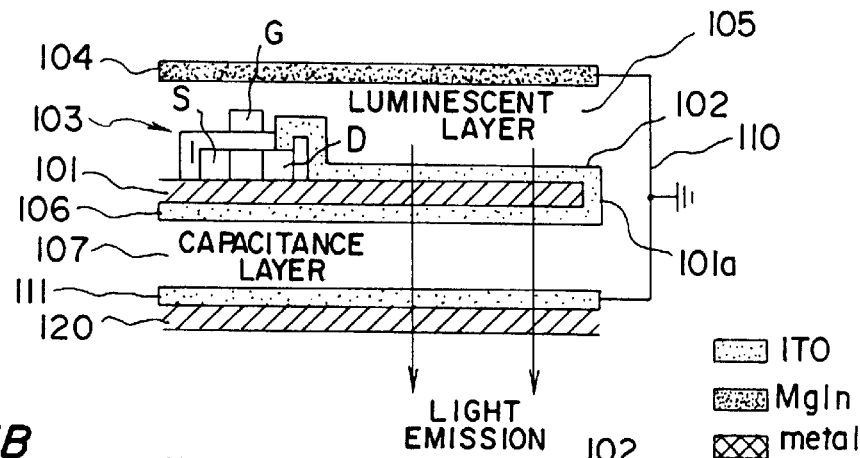
FIG. 5A is a cross-sectional view simply showing a principal part of a self-emission type image display panel according to a second embodiment of the present invention.
Figure 5B:
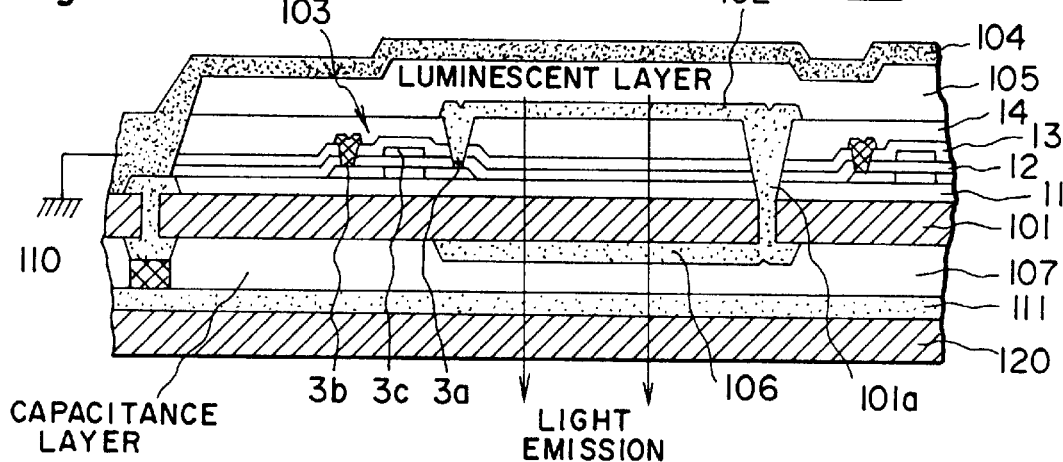
FIG. 5B is a cross-sectional view specifically showing the principal part.
Figure 5C:
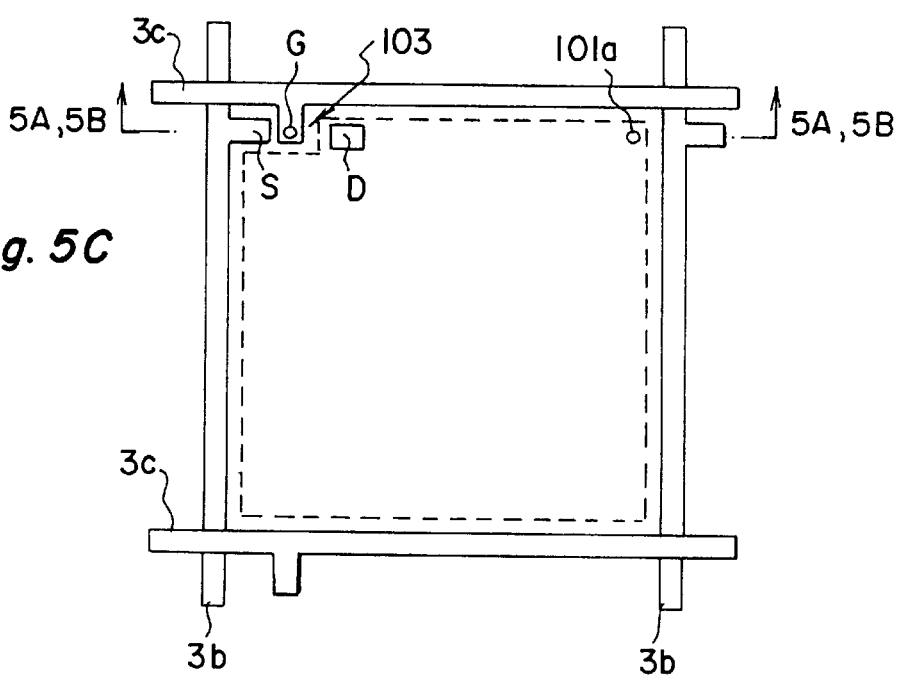
FIG. 5C is a schematic plan view showing a portion of one luminescent pixel element of the panel.

A self-emission type image display panel according to a second embodiment will be described on the basis of FIGS. 5A, 5B and 5C. FIG. 5A is a cross-sectional view simply showing a principal part of the panel, and FIG. 5B is a cross-sectional view specifically showing the principal part. FIGS. 5A and FIG. 5B differ in that a pixel electrode 102 is directly formed on a first transparent substrate 101 in FIG. 5A, while a pixel electrode 102 is not directly formed on a first transparent substrate 101 in FIG. 5B and in the other minute points, but have common characteristics of the present embodiment. FIG. 5C is a plan view for explaining a region of one pixel element of the self-emission type image display panel according to the present embodiment. A line A—A in FIG. 5C indicates a cutting line in the cross-sectional views of FIGS. 5A and 5B. The structure of a TFT constituting a driving element 103 is the same as that in the embodiment 1 and hence, the description thereof is not repeated by assigning the same reference numerals as those shown in FIG. 1B.

The self-emission type image display panel according to the present embodiment comprises a first transparent substrate 101, transparent pixel electrodes (ITO) 102 and driving elements 103 for respectively driving the transparent pixel electrodes 102 which are respectively formed on one surface of the first transparent substrate 101, a common electrode (MgIn, AlLi) 104 provided opposite to the one surface of the first transparent substrate 101, a luminescent layer 105 provided between the common electrode 104 and the first transparent substrate 101 for emitting light toward the transparent pixel electrodes 102, transparent discrete capacitance electrodes (ITO) 106 formed on the other surface of the first transparent substrate 101, a second transparent substrate 120 provided opposite to the other surface of the first transparent substrate 101, a transparent common capacitance electrode (ITO) 111 formed on one surface of the second transparent substrate 120 (a surface opposite to the first transparent substrate 101), and a transparent capacitance layer 107 provided between the transparent common capacitance electrode 111 and the first transparent substrate 101.

Each of the discrete capacitance electrodes 106 and the corresponding pixel electrode 102 are connected to each other by a contact hole 101a penetrating the first transparent substrate 101 and the like. Further, the transparent common capacitance electrode 111 and the common electrode 104 are connected to each other by a connecting portion 110 composed of Al or the like penetrating the first transparent substrate 101 and the transparent capacitance layer 107, and the common electrode 104 is connected to the ground in a peripheral edge portion of the panel, for example. In the present embodiment, organic EL elements and a liquid crystal are respectively used as the luminescent layer 105 and the transparent capacitance layer 107, as in the embodiment 1.

The self-emission type image display panel having such a structure in the embodiment 2 differs from that in the embodiment 1 in that light emitted in the luminescent layer is emitted without passing through the capacitance layer in the embodiment 1, while light emitted in the luminescent layer 105 is emitted upon passing through the capacitance layer 107 in the embodiment 2. Also in the structure in the embodiment 2, when the driving elements 103 are turned off, charge stored in the capacitance layer 107 flows into the luminescent layer 105 and a state where the luminescent layer 105 emits light is maintained depending on the amount of the stored charge, as in the embodiment 1. The panel has a structure in which capacitance means for respectively holding signals fed to luminescent pixel elements are formed with each of the capacitance means and the corresponding luminescent pixel element laminated, that is, a structure in which the capacitance means can be formed on the entire display panel surface, whereby the miniaturization thereof is easier, and a required capacity is ensured more easily, as compared with that having a structure in which the capacitance means are formed in a region other than the display panel surface. Therefore, it is possible to significantly improve the capability to prevent flickering.

(Embodiment 3)

Figure 6A:
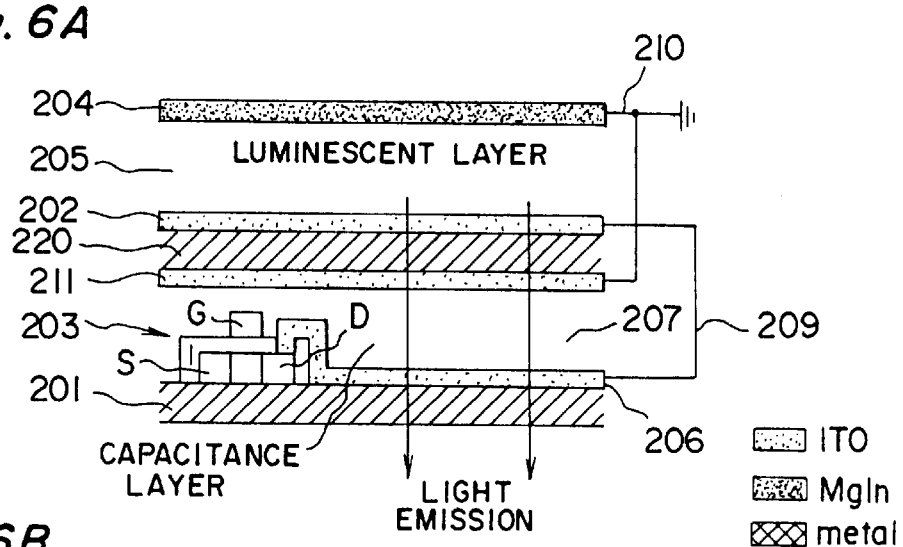
FIG. 6A is a cross-sectional view simply showing a principal part of a self-emission type image display panel according to a third embodiment of the present invention.
Figure 6B:
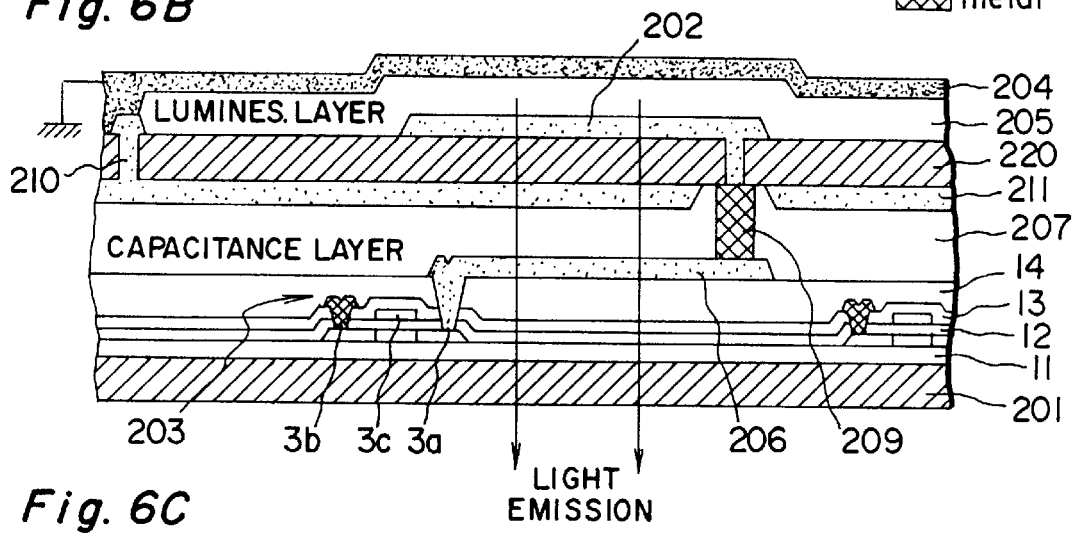
FIG. 6B is a cross-sectional view specifically showing the principal part.
Figure 6C:
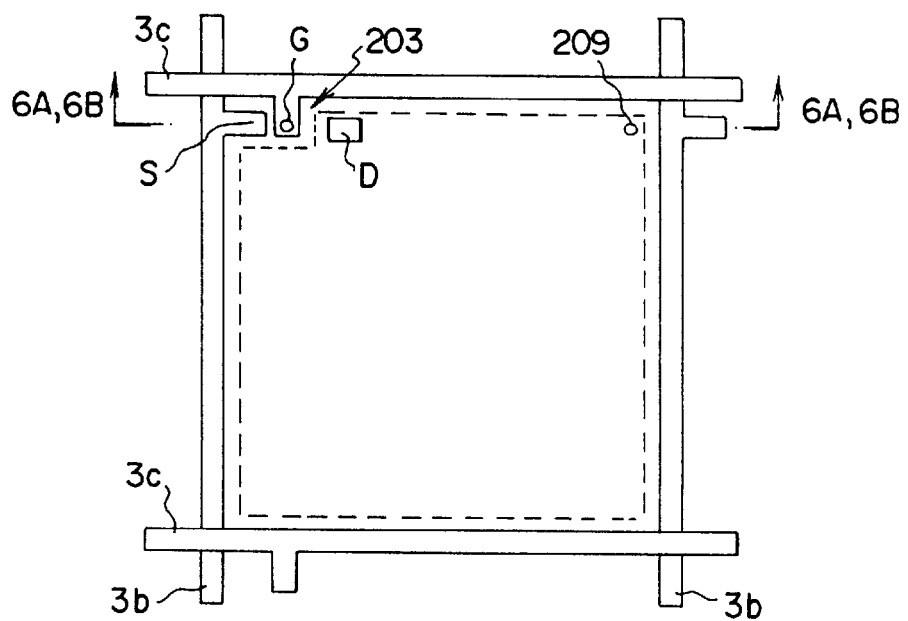
FIG. 6C is a schematic plan view showing a portion of one luminescent pixel element of the panel.

A self-emission type image display panel according to a third embodiment will be described on the basis of FIGS. 6A, 6B and 6C. FIG. 6A is a cross-sectional view simply showing a principal part of the panel, and FIG. 6B is a cross-sectional view specifically showing the principal part. FIGS. 6A and FIG. 6B differ in that a transparent discrete capacitance electrode 206 is directly formed on a first transparent substrate 201 in FIG. 6A, while a transparent discrete capacitance electrode 206 is not directly formed on a first transparent substrate 201 in FIG. 6B and in the other minute points, but have common characteristics of the present embodiment. FIG. 6C is a plan view for explaining a region of one pixel element of the self-emission type image display panel according to the present embodiment. A line A—A in FIG. 6C indicates a cutting line in the cross-sectional views of FIGS. 6A and 6B. The structure of a TFT constituting a driving element 203 is the same as that in the embodiment 1 and hence, the description thereof is not repeated by assigning the same reference numerals as those shown in FIG. 1B.

The self-emission type image display panel according to the present embodiment comprises a first transparent substrate 201, transparent discrete capacitance electrodes (ITO) 206 and driving elements 203 for respectively driving the transparent discrete capacitance electrodes 206 which are respectively formed on one surface of the first transparent substrate 201, a transparent common capacitance electrode (ITO) 211 provided opposite to the one surface of the first transparent substrate 201, a transparent capacitance layer 207 provided between the transparent common capacitance electrode 211 and the first transparent substrate 201, a second transparent substrate 220 having the transparent common capacitance electrode 211 formed on its one surface, while having transparent pixel electrodes (ITO) 202 formed on the other surface, a common electrode (MgIn or AlLi) 204 provided opposite to the second transparent substrate 220, and a luminescent layer 205 formed between the common electrode 204 and the transparent pixel electrodes 202 for emitting light toward the transparent pixel electrodes 202.

Each of the transparent discrete capacitance electrodes 206 and the corresponding transparent pixel electrode 202 are connected to each other by a connecting portion 209 composed of ITO penetrating the second transparent substrate 220 and Al existing inside the transparent capacitance layer 207. Further, the transparent common capacitance electrode 211 and the common electrode 204 are connected to each other by a connecting portion 210 penetrating the second transparent substrate 220, and are connected to the ground in a peripheral edge portion of the panel, for example. In the present embodiment, organic EL elements and a liquid crystal are respectively used as the luminescent layer 205 and the transparent capacitance layer 207, as in the embodiment 1.

The self-emission type image display panel according to the embodiment 3 differs from that in the embodiment 2 in that the driving elements are provided in the luminescent layer in the embodiment 2, while the driving elements are provided in the capacitance layer in the embodiment 3. Also in the structure in the embodiment 3, when the driving elements 203 are turned off, charge stored in the capacitance layer 207 flows into the luminescent layer 205, and a state where the luminescent layer 205 emits light is maintained depending on the amount of the stored charge, as in the embodiments 1 and 2. The panel has a structure in which capacitance means for respectively holding signals fed to luminescent pixel elements are formed with each of the capacitance means and the corresponding luminescent pixel element laminated, that is, a structure in which the capacitance means can be formed on the entire display panel surface, whereby the miniaturization thereof is easier, and a required capacity is ensured more easily, as compared with that having a structure in which the capacitance means are formed in a region other than the display panel surface. Therefore, it is possible to significantly improve the capability to prevent flickering.

(Embodiment 4)

Figure 7A:
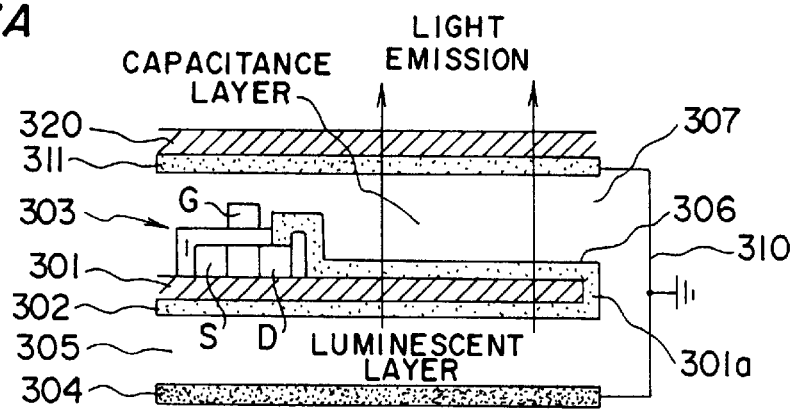
FIG. 7A is a cross-sectional view simply showing a principal part of a self-emission type image display panel according to a fourth embodiment of the present invention.
Figure 7B:
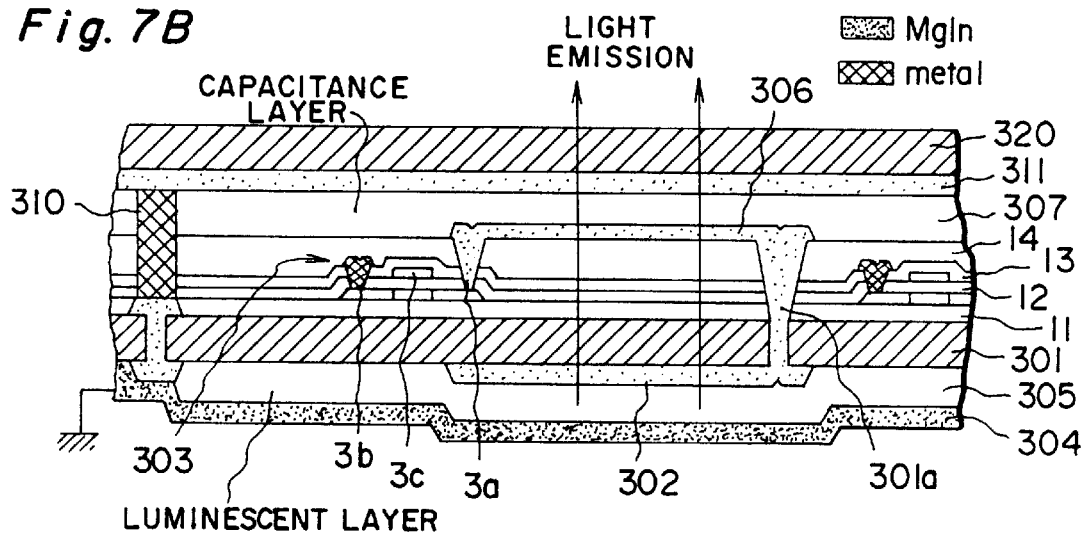
FIG. 7B is a cross-sectional view specifically showing the principal part.
Figure 7C:
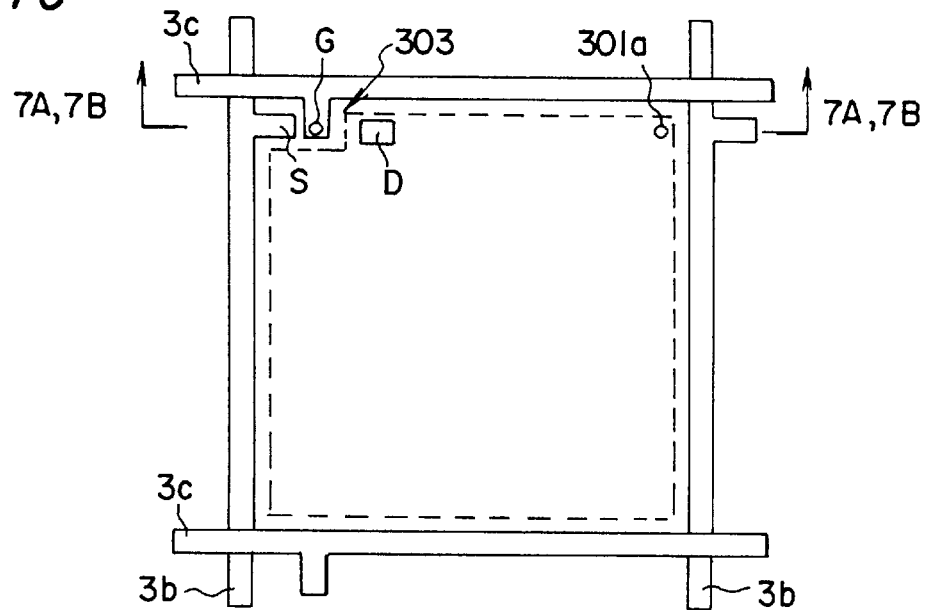
FIG. 7C is a schematic plan view showing a portion of one luminescent pixel element of the panel.

A self-emission type image display panel according to a fourth embodiment will be described on the basis of FIGS. 7A, 7B and 7C. FIG. 7A is a cross-sectional view simply showing a principal part of the panel, and FIG. 7B is a cross-sectional view specifically showing the principal part. FIG. 7A and FIG. 7B differ in that a transparent discrete capacitance electrode 306 is directly formed on a first transparent substrate 301 in FIG. 7A, while a transparent discrete capacitance electrode 306 is not directly formed on a first transparent substrate 301 in FIG. 7B and in the other minute points, but have common characteristics of the present embodiment. FIG. 7C is a plan view for explaining a region of one pixel element of the self-emission type image display panel according to the present embodiment. A line A—A in FIG. 7C indicates a cutting line in the cross-sectional views of FIGS. 7A and 7B. The structure of a TFT constituting a driving element 303 is the same as that in the embodiment 1 and hence, the description thereof is not repeated by assigning the same reference numerals as those shown in FIG. 1B.

The self-emission type image display panel according to the present embodiment comprises a first transparent substrate 301, transparent discrete capacitance electrodes (ITO) 306 and driving elements 303 for respectively driving the transparent discrete capacitance electrodes 306 which are respectively formed on one surface of the first transparent substrate 301, a second transparent substrate 320 provided opposite to the one surface of the first transparent substrate 301, a transparent common capacitance electrode (ITO) 311 formed on one surface of the second transparent substrate 320 (a surface opposite to the first transparent substrate 301), a transparent capacitance layer 307 provided between the transparent common capacitance electrode 311 and the first transparent substrate 301, transparent pixel electrodes (ITO) 302 formed on the other surface of the first transparent substrate 301, a common electrode (AlLi) 304 provided opposite to the other surface of the first transparent substrate 301, and a luminescent layer 305 provided between the common electrode 304 and the transparent pixel electrodes 302 for emitting light toward the transparent pixel electrodes 302.

Each of the transparent discrete capacitance electrodes 306 and the corresponding transparent pixel electrode 302 are connected to each other by a contact hole 301a penetrating the first transparent substrate 301, insulating layers 11, 12, and 13 constituting the TFT, and a flattened film 14. Further, the transparent common capacitance electrode 311 and the common electrode 304 are connected to each other by a connecting portion 310 penetrating the insulating layers 11, 12, and 13 constituting the TFT, the flattened film 14, and the capacitance layer 307, and are further connected to the ground in a peripheral edge portion of the panel. In the present embodiment, organic EL elements and a liquid crystal are respectively used as the luminescent layer 305 and the transparent capacitance layer 307, as in the embodiment 1.

The self-emission type image display panel according to the embodiment 4 is common to that in the embodiment 2 in that the pixel electrode and the discrete capacitance electrode are connected to each other by the contact hole, and is common to that in the embodiment 3 in that the driving elements are provided in the capacitance layer. Also in the structure in the embodiment 4, when the driving elements 303 are turned off, charge stored in the capacitance layer 307 flows into the luminescent layer 305, and a state where the luminescent layer 305 emits light is maintained depending on the amount of the stored charge, as in the embodiment 1. The panel has a structure in which capacitance means for respectively holding signals fed to the luminescent pixel elements are formed with each of the capacitance means and the corresponding luminescent pixel element laminated, that is, a structure in which the capacitance means can be formed on the entire display panel surface, whereby the miniaturization thereof is easier, and a required capacity is ensured more easily, as compared with that having a structure in which capacitance means are formed in a region other than the display panel surface. Therefore, it is possible to significantly improve the capability to prevent flickering.

(Embodiment 5)

Figure 8A:
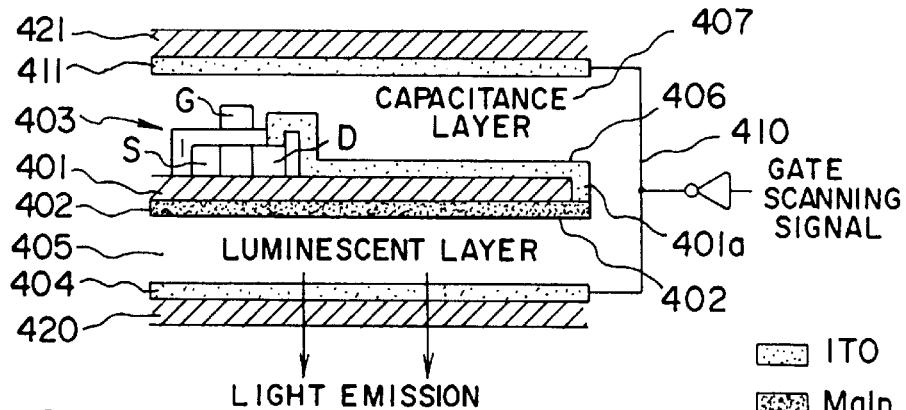
FIG. 8A is a cross-sectional view simply showing a principal part of a self-emission type image display panel according to a fifth embodiment of the present invention.
Figure 8B:
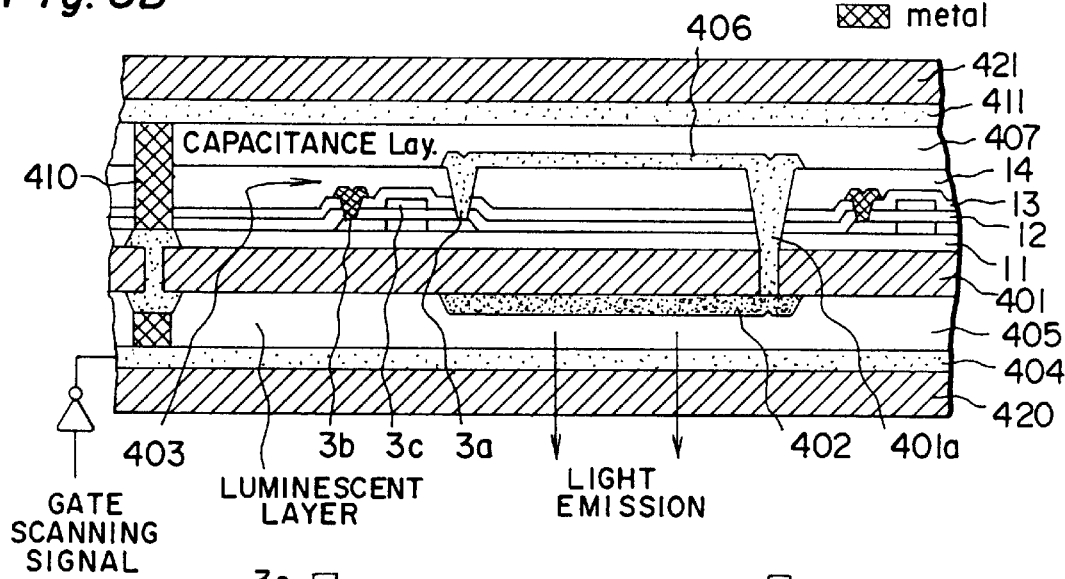
FIG. 8B is a cross-sectional view specifically showing the principal part.
Figure 8C:
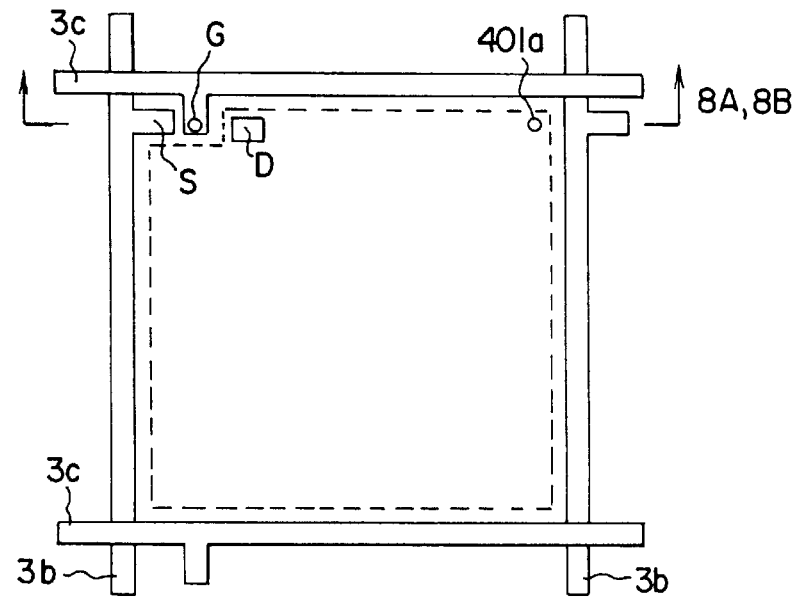
FIG. 8C is a schematic plan view showing a portion of one luminescent pixel element of the panel.

A self-emission type image display panel according to a fifth embodiment will be described on the basis of FIGS. 8A, 8B and 8C. FIG. 8A is a cross-sectional view simply showing a principal part of the panel, and FIG. 8B is a cross-sectional view specifically showing the principal part. FIGS. 8A and FIG. 8B differ in that a discrete capacitance electrode 406 is directly formed on a glass substrate 401 in FIG. 8A, while a discrete capacitance electrode 406 is not directly formed on a glass substrate 401 in FIG. 8B and in the other minute points, but have common characteristics of the present embodiment. FIG. 8C is a plan view for explaining a region of one pixel element of the self-emission type image display panel according to the present embodiment. A line A—A in FIG. 8C indicates a cutting plane in the cross-sectional views of FIGS. 8A and 8B. The structure of a TFT constituting a driving element 403 is the same as that in the embodiment 1 and hence, the description thereof is not repeated by assigning the same reference numerals as those shown in FIG. 1B.

The self-emission type image display panel according to the present embodiment comprises a glass substrate 401, discrete capacitance electrodes (ITO) 406 and driving elements 403 for respectively driving the discrete capacitance electrodes 406 which are respectively formed on one surface of the glass substrate 401, a glass substrate 421 provided opposite to one surface of the glass substrate 401, a common capacitance electrode (ITO) 411 formed on one surface of the glass substrate 421 (a surface opposite to the glass substrate 401), a capacitance layer 407 provided between the common capacitance electrode 411 and the glass substrate 401, pixel electrodes (AlLi or MgIn) 402 formed on the other surface of the glass substrate 401, a transparent glass substrate 420 provided opposite to the other surface of the glass substrate 401, a transparent common electrode (ITO) 404 formed on one surface of the transparent glass substrate 420 (a surface opposite to the glass substrate 401), and a luminescent layer 405 provided between the transparent common electrode 404 and the pixel electrodes 402 for emitting light toward the transparent common electrode 404.

Each of the discrete capacitance electrodes 406 and the corresponding pixel electrode 402 are connected to each other by a contact hole 401a penetrating the glass substrate 401, insulating layers 11, 12, and 13 constituting the TFT, and a flattened film 14. Further, the common capacitance electrode 411 and the transparent common electrode 404 are connected to each other by a connecting portion 410 penetrating the luminescent layer 405, the insulating layers 11, 12, and 13 constituting the TFT, the flattened film 14, and the capacitance layer 407, and are further connected to a gate scanning signal inverted input portion or a source signal inverted input portion in a peripheral edge portion of the panel. In the present embodiment, organic EL elements and a liquid crystal are respectively used as the luminescent layer 405 and the transparent capacitance layer 407, as in the embodiment 1.

In order to obtain such a structure, ITO (the common electrode 404), for example, is formed on the transparent glass substrate 420, a hole transporting layer, a luminescent layer, and an electron transporting layer which are to be organic EL element layers are formed in this order on the ITO, a part of the connecting portion 410 is formed, and AlLi or MgIn (the pixel electrode 402), for example, is further formed. On the other hand, the TFT, ITO (the discrete capacitance electrode 406), and a part of the connecting portion 410 are formed on the glass substrate 401. The transparent glass substrate 420 and the glass substrate 401 are bonded to each other, and the ITO (the discrete capacitance electrode 406) and the AlLi or MgIn (the pixel electrode 402) are electrically connected to each other by the contact hole 401a. The glass substrate 401 and the glass substrate 421 on which ITO (the common capacitance electrode 411) is formed are then affixed to each other. In this affixed state, the connecting portion 410 electrically connects the common capacitance electrode 411 and the transparent common electrode 404. A portion between the glass substrate 401 and the glass substrate 421 is filled with a liquid crystal.

In the structure in the embodiment 5, when the TFT is turned on, a potential at the common electrode 404 (ITO) is lower than that at its drain by applying reversed pulses of a gate signal or a source signal, as shown, so that the luminescent layer 405 composed of the organic EL elements do not emit light by a reverse bias, while the capacitance layer 407 is charged. When the TFT is then turned off, a potential at the drain is lower than that at the common electrode 404, so that charge stored in the capacitance layer 407 flows into the luminescent layer 405, so that the luminescent layer emits light. The inherent light emission time is shortened, while the light emission time can be lengthened as a whole. Further, light is emitted in reverse direction to the TFT, whereby a high aperture ratio is obtained.

(Embodiment 6)

Figure 9A:
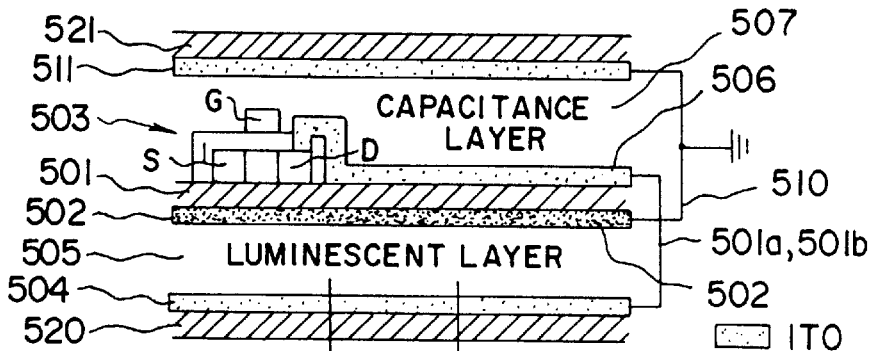
FIG. 9A is a cross-sectional view simply showing a principal part of a self-emission type image display panel according to a sixth embodiment of the present invention.
Figure 9B:
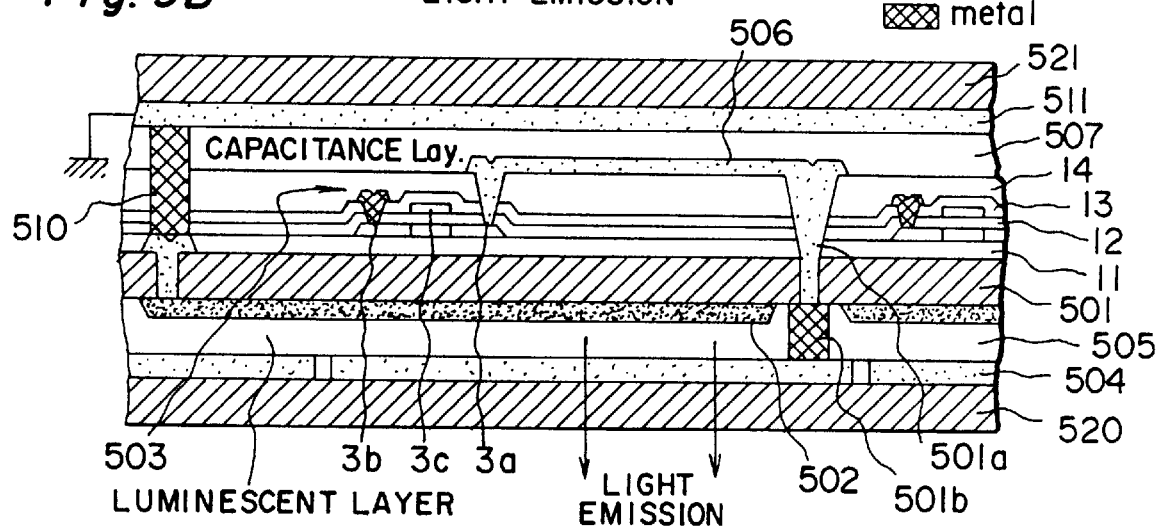
FIG. 9B is a cross-sectional view specifically showing the principal part.
Figure 9C:
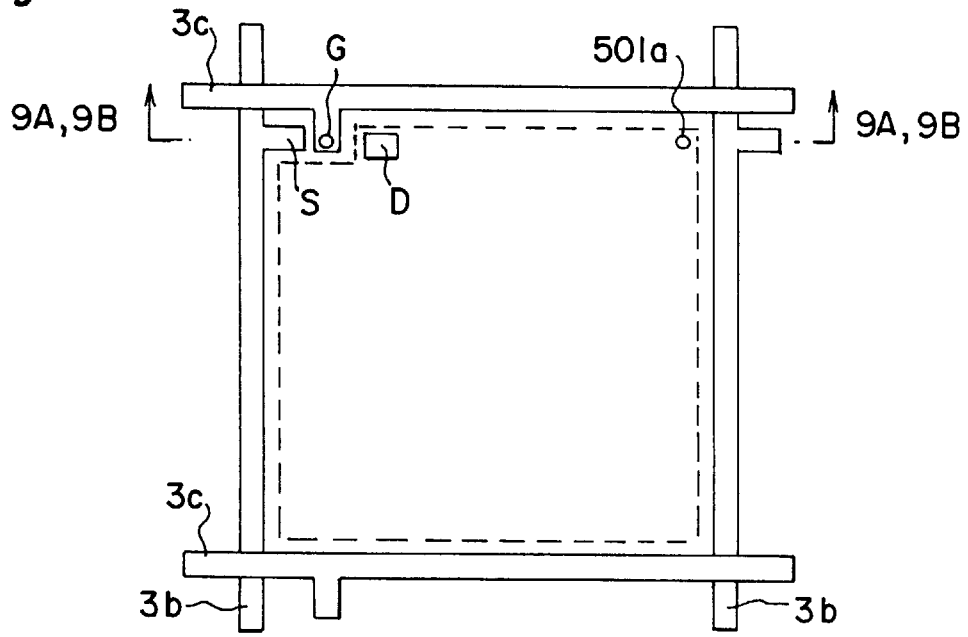
FIG. 9C is a schematic plan view showing a portion of one luminescent pixel element of the panel.

A self-emission type image display panel according to a sixth embodiment will be described on the basis of FIGS. 9A, 9B, and 9C. FIG. 9A is a cross-sectional view simply showing a principal part of the panel, and FIG. 9B is a cross-sectional view specifically showing the principal part. FIGS. 9A and FIG. 9B differ in that a discrete capacitance electrode 506 is directly formed on a glass substrate 501 in FIG. 9A, while a discrete capacitance electrode 506 is not directly formed on a glass substrate 501 in FIG. 9B and in the other minute points, but have common characteristics of the present embodiment. FIG. 9C is a plan view for explaining a region of one pixel element of the self-emission type image display panel according to the present embodiment. A line A—A in FIG. 9C indicates a cutting plane in the cross-sectional views of FIG. 9A and 9B. The structure of a TFT constituting a driving element 503 is the same as that in the embodiment 1 and hence, the description thereof is not repeated by assigning the same reference numerals as those shown in FIG. 1B.

The self-emission type image display panel according to the present embodiment comprises a glass substrate 501, discrete capacitance electrodes (ITO) 506 and driving elements 503 for respectively driving the discrete capacitance electrodes 506 which are respectively formed on one surface of the glass substrate 501, a glass substrate 521 provided opposite to one surface of the glass substrate 501, a common capacitance electrode (ITO) 511 formed on one surface of the glass substrate 521 (a surface opposite to the glass substrate 501), a capacitance layer 507 provided between the common capacitance electrode 511 and the glass substrate 501, a common electrode (AlLi) 502 formed on the other surface of the glass substrate 501, a transparent glass substrate 520 provided opposite to the other surface of the glass substrate 501, transparent pixel electrodes (ITO) 504 formed on one surface of the transparent glass substrate 520 (a surface opposite to the glass substrate 501), and a luminescent layer 505 provided between the transparent pixel electrodes 504 and the common electrode 502 for emitting light toward the transparent pixel electrodes 504.

Each of the discrete capacitance electrodes 506 and the corresponding pixel electrode 504 are connected to each other by a contact hole 501a penetrating the glass substrate 501, insulating layers 11, 12, and 13 constituting the TFT, and a flattened film 14 and Al metal 501b existing in the luminescent layer 505. Further, the common capacitance electrode 511 and the common electrode 502 are connected to each other by a connecting portion 510 penetrating the glass substrate 501, the insulating layers 11, 12, and 13 constituting the TFT, the flattened film 14, and the capacitance layer 507, and are further connected to the ground in a peripheral edge portion of the panel. In the present embodiment, organic EL elements and a liquid crystal are respectively used as the luminescent layer 505 and the transparent capacitance layer 507, as in the embodiment 1. An insulating film may be formed around the Al metal 501b.

In order to obtain such a structure, ITO (the transparent pixel electrode 504) and the Al metal 501b, for example, are formed on the transparent glass substrate 520, a hole transporting layer, a luminescent layer, and an electron transporting layer which are to be organic EL element layers are formed in this order on the ITO, and AlLi (the common electrode 502), for example, is further formed. On the other hand, the TFT, ITO (the discrete capacitance electrode 506), and the connecting portion 510 are formed on the glass substrate 501. The transparent glass substrate 520 and the glass substrate 501 are bonded to each other, and the ITO (the discrete capacitance electrode 506) and the ITO (the transparent pixel electrode 504) are electrically connected to each other by the contact hole 501a and the Al metal 501b. The glass substrate 501 and the glass substrate 521 on which ITO (the common capacitance electrode 511) is formed are affixed to each other. In this affixed state, the connecting portion 510 electrically connects the common capacitance electrode 511 and the common electrode 502. A portion between the glass substrate 501 and the glass substrate 521 is filled with a liquid crystal.

In the structure in the embodiment 6, when the driving elements 503 are turned off, charge stored in the capacitance layer 507 flows into the luminescent layer 505, and a state where the luminescent layer 505 emits light is maintained depending on the amount of the stored charge, as in the embodiment 1. The panel has a structure in which capacitance means for respectively holding signals fed to the luminescent pixel elements are formed with each of the capacitance means and the corresponding luminescent pixel element laminated, that is, a structure in which the capacitance means can be formed on the entire display panel surface, whereby the miniaturization thereof is easier, and a required capacity is ensured more easily, as compared with that having a structure in which capacitance means are formed in a region other than the display panel surface. Therefore, it is possible to significantly improve the capability to prevent flickering. Further, light is emitted in the opposite direction to the TFT, whereby a high aperture ratio is obtained.

Although in the above-mentioned embodiments, description was made of a case where a liquid crystal is used as a capacitance layer, the liquid crystal can be also replaced with dielectric ceramics. It goes without saying that in a structure in which light is emitted through a capacitance layer as shown in FIG. 5, transparent dielectric ceramics is used.

Examples of the transparent dielectric ceramics include PLZT (Pb-La-Zr-Ti ceramic) and [ZnO, (Pb.Ba) (Zr.Ti)O$_3$]. When the PLZT is used, the dielectric constant $\epsilon$ is approximately 1000. When this value is substituted in the equation A shown in the embodiment 1, the required thickness d of the PLZT is d=1000×8.85×10$^{-12}$×50×150×10$^{-12}$/(25×10$^{-11}$)=2500. That is, when the PLZT is used as the capacitance layer, not more than 2500 [Å] is required as the thickness thereof under the above-mentioned conditions.

In a case where the transparent dielectric ceramics is used as the capacitance layer, a fabricating method in a case where the structure in FIG. 5 showing the embodiment 2 is employed will be described with reference to FIG. 5. ITO (a transparent common capacitance electrode 111) is first formed on a second transparent substrate 120, and PLZT is formed on the ITO by a thin film forming method such as a sputtering method. Further, a part of a connecting portion 110 is formed. A first transparent substrate 101 on which ITO (a discrete capacitance electrode 106) is formed is affixed to PLZT. Driving elements (TFT) 103 and ITO (a pixel electrode 102) are formed on the first transparent substrate 101, and the ITO (the pixel electrode 102) and the ITO (the discrete capacitance electrode 106) are connected to each other by a contact hole 101a. A triphenylamine derivative (MTDATA) is then deposited to a thickness of 400 Å on the ITO (the pixel electrode 102). The deposition is performed by vacuum evaporation using a resistance heating board under the vacuum of $5\times10^{-6}$ Torr. A diamine derivative (TPD) and rubrene are then deposited to a thickness of 300 Å by an evaporation method such that the weight ratio of the rubrene is 5%. Tris (8-quinolinol) aluminum ($Alq_3$) is then deposited to a thickness of 500 Å by vacuum evaporation. An MgIn alloy (Mg:In=50:3), for example, is further deposited thereon to a thickness of 2000 Å by a resistance heating evaporation method.

Since organic EL elements may lose its light emitting function if high heat is applied thereto, it is not desired that dielectric ceramics is formed after a luminescent layer composed of the organic EL element is formed. It is desired that the dielectric ceramics is formed by the above-mentioned steps, or is formed by affixing a substrate on which dielectric ceramics is previously deposited to a substrate on which a luminescent pixel element is formed. A fabricating method using the affixing is suitable for a case where dielectric ceramics is used in the structure in FIG. 1 (the dielectric ceramics may not be transparent in this structure). In this sense, a structure in which a liquid crystal which is formed without requiring heat is used as a capacitance layer can be fabricated more easily.

Although in the above-mentioned embodiment, an organic EL element layer having a three-layer structure is shown as the organic EL element layer which is a luminescent layer, it may have a two-layer structure. Further, each of capacitance layers can be formed in approximately the same size as the pixel area, so that a large capacity can be ensured. However, it is not necessarily necessary that the area of the capacitance layer should be approximately the same as the pixel area. The area of the capacitance layer should be determined from the relationship between a required capacity and the thickness of the capacitance layer. Further, the MgIn alloy may be replaced with an aluminum-lithium alloy (Al:Li=99.5:0.5). When a liquid crystal is used as the capacitance layer, the liquid crystal may be interposed between polarizing plates so that its corresponding liquid crystal portion enters a light transmitted state when the luminescent layer emits light.

As described in the foregoing, according to the present invention, each capacitance is formed in a region corresponding to a region where a luminescent pixel element is formed, whereby it is possible to prevent the self-emission type image display device from being increased in size. Although the capacitance is thus formed in the region corresponding to the region where the luminescent pixel element is formed, it is formed in a laminated state.

Therefore, the light emitting area of the luminescent pixel element is not eroded, thereby making it possible to prevent the light emitting area from being reduced. Further, a large capacity can be easily obtained using a liquid crystal or the like, thereby producing the effect of eliminating the flickering of a screen by extending a time period during which the luminescent pixel element emits light by a required time period.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A self-emission type image display device comprising:

capacitance means for respectively holding signals fed to luminescent pixel elements formed with each of the capacitance means, wherein said capacitance means respectively comprise discrete capacitance electrodes provided apart from pixel electrodes, each discrete capacitance electrode is electrically connected to a corresponding pixel electrode, and a capacitance layer in each of said capacitance means is an opaque or transparent capacitance layer formed on a reverse surface to the light emission surface of the luminescent pixel element.

2. A self-emission type image display device comprising:

capacitance means for respectively holding signals fed to luminescent pixel elements formed with each of the capacitance means, wherein said capacitance means respectively comprise discrete capacitance electrodes provided apart from pixel electrodes, each discrete capacitance electrode is electrically connected to a corresponding pixel electrode, and one driving element is used as both driving means in each of the luminescent pixel elements and charging control means in the capacitance means corresponding to the luminescent pixel element.

3. A self-emission type image display device comprising:

capacitance means for respectively holding signals fed to luminescent pixel elements formed with each of the capacitance means, wherein said capacitance means respectively comprise discrete capacitance electrodes provided apart from pixel electrodes, each discrete capacitance electrode is electrically connected to a corresponding pixel electrode, a capacitance layer in each of said capacitance means is a transparent capacitance layer formed on a light emission surface of the luminescent pixel element, and one driving element is used as both driving means in each of the luminescent pixel elements and charging control means in the capacitance means corresponding to the luminescent pixel element.

4. The self-emission type image display device according to claim 1, wherein one driving element is used as both driving means in each of the luminescent pixel elements and charging control means in the capacitance means corresponding to the luminescent pixel element.

5. A self-emission type image display device, comprising:

a transparent substrate;

a group of transparent pixel electrodes formed on the transparent substrate;

a common electrode provided opposite to said transparent substrate, a luminescent layer provided between the common electrode and said transparent substrate for emitting light through the transparent pixel electrodes;

a group of discrete capacitance electrodes provided opposite to said common electrode; and a capacitance layer provided between said common electrode and the group of discrete capacitance electrodes, wherein each transparent pixel electrode is electrically connected to a corresponding capacitance electrode and each transparent pixel electrode and said corresponding capacitance electrode are positioned to intersect a corresponding line perpendicular to a surface of said transparent substrate.

6. A self-emission type image display device, comprising:

a first transparent substrate;

a group of transparent pixel electrodes and a group of driving elements for respectively driving the transparent pixel electrodes which are respectively formed on one surface of the first transparent substrate;

a common electrode provided opposite to one surface of said first transparent substrate, a luminescent layer provided between the common electrode and said first transparent substrate for emitting light toward said transparent pixel electrodes;

a group of transparent discrete capacitance electrodes formed on the other surface of said first transparent substrate;

a transparent common capacitance electrode formed on a surface, which is opposite to the first transparent substrate, of the second transparent substrate provided opposite to the other surface of the first transparent substrate; and a transparent capacitance layer provided between the transparent common capacitance electrode and the first transparent substrate, the corresponding electrodes in said group of transparent discrete capacitance electrodes and the group of transparent pixel electrodes being connected to each other by a contact hole formed in said first transparent substrate.

7. A self-emission type image display device, comprising:

a first transparent substrate;

a group of transparent discrete capacitance electrodes and a group of driving elements for respectively driving the transparent discrete capacitance electrodes which are respectively formed on one surface of the first transparent substrate;

a transparent common capacitance electrode provided opposite to one surface of said first transparent substrate, a transparent capacitance layer provided between the transparent common capacitance electrode and the first transparent substrate;

a second transparent substrate having said transparent common capacitance electrode formed on its one surface and having a group of transparent pixel electrodes on the other surface;

a common electrode provided opposite to the second transparent substrate; and a luminescent layer formed between the common electrode and the group of transparent pixel electrodes for emitting light toward the transparent pixel electrodes, the corresponding electrodes in said transparent discrete capacitance electrodes and the transparent pixel electrodes being connected to each other.

8. A self-emission type image display device, comprising:

a first transparent substrate;

a group of transparent discrete capacitance electrodes and a group of driving elements for respectively driving the transparent discrete capacitance electrodes which are respectively formed on one surface of the first transparent substrate;

a transparent common capacitance electrode formed on a surface, which is opposite to the first transparent substrate, of the second transparent substrate provided opposite to one surface of the first transparent substrate, a transparent capacitance layer provided between the transparent common capacitance electrode and the first transparent substrate;

a group of transparent pixel electrodes formed on the other surface of said first transparent substrate;

a common electrode provided opposite to the other surface of the first transparent substrate; and a luminescent layer provided between the common electrode and the group of transparent pixel electrodes for emitting light toward the transparent pixel electrodes, the corresponding electrodes in said group of transparent discrete capacitance electrodes and the group of transparent pixel electrodes being connected to each other by a contact hole formed in said first transparent substrate.

9. A self-emission type image display device, comprising:

a substrate;

a group of discrete capacitance electrodes and a group of driving elements for respectively driving the discrete capacitance electrodes which are respectively formed on one surface of the substrate;

a common capacitance electrode provided opposite to one surface of said substrate, a capacitance layer provided between the common capacitance electrode and the substrate;

a group of pixel electrodes formed on the other surface of said substrate;

a transparent common electrode provided on a surface, which is opposite to the substrate, of the transparent substrate provided opposite to the other surface of the substrate; and a luminescent layer provided between the transparent common electrode and the group of pixel electrodes for emitting light toward the transparent common electrode, the corresponding electrodes in said group of discrete capacitance electrodes and the group of pixel electrodes being connected to each other by a contact hole formed in said substrate.

10. A self-emission type image display device, comprising:

a substrate;

a group of discrete capacitance electrodes and a group of driving elements for respectively driving the discrete capacitance electrodes which are respectively formed on one surface of the substrate;

a common capacitance electrode provided opposite to one surface of said substrate, a capacitance layer provided between the common capacitance electrode and the substrate;

a common electrode formed on the other surface of said substrate;

a group of transparent pixel electrodes formed on a surface, which is opposite to the substrate, of the transparent substrate provided opposite to the other surface of the substrate; and a luminescent layer provided between the group of transparent pixel electrodes and the common electrode for emitting light toward the transparent pixel electrodes, the corresponding electrodes in said group of discrete capacitance electrodes and the group of transparent pixel electrodes being connected to each other by a contact hole formed in said substrate and a conductor provided in the luminescent layer.

11. A self-emission type image display device comprising:

capacitance means for respectively holding signals fed to luminescent pixel elements formed with each of the capacitance means, wherein said capacitance means respectively comprise discrete capacitance electrodes provided apart from pixel electrodes, each discrete capacitance electrode is electrically connected to a corresponding pixel electrode, and a capacitance layer of the capacitance means is a liquid crystal layer.

12. A self-emission type image display device comprising:

capacitance means for respectively holding signals fed to luminescent pixel elements formed with each of the capacitance means, wherein said capacitance means respectively comprise discrete capacitance electrodes provided apart from pixel electrodes, each discrete capacitance electrode is electrically connected to a corresponding pixel electrode, and the capacitance layer of the capacitance means is a dielectric ceramic layer or a transparent dielectric ceramic layer.

13. A self-emission type image display device comprising:

capacitance means for respectively holding signals fed to luminescent pixel elements formed with each of the capacitance means, wherein said capacitance means respectively comprise discrete capacitance electrodes provided apart from pixel electrodes, each discrete capacitance electrode is electrically connected to a corresponding pixel electrode, and a luminescent layer associated with the pixel electrodes is an organic electroluminescent layer.

14. A self-emission type image display device comprising:

a transparent substrate;

a group of transparent pixel electrodes and a group of driving elements for respectively driving the transparent pixel electrodes which are respectively formed on the transparent substrate;

a common electrode provided opposite to said transparent substrate, a luminescent layer provided between the common electrode and said transparent substrate for emitting light toward the transparent pixel electrodes;

a group of discrete capacitance electrodes provided opposite to said common electrode; and a capacitance layer provided between said common electrode and the group of discrete capacitance electrodes, wherein the corresponding electrodes in said group of discrete capacitance electrodes and the group of pixel electrodes being electrically connected to each other, and the capacitance layer is a liquid crystal layer.

15. A self-emission type image display device comprising:

a transparent substrate;

a group of transparent pixel electrodes and a group of driving elements for respectively driving the transparent pixel electrodes which are respectively formed on the transparent substrate;

a common electrode provided opposite to said transparent substrate, a luminescent layer provided between the common electrode and said transparent substrate for emitting light toward the transparent pixel electrodes;

a group of discrete capacitance electrodes provided opposite to said common electrode; and a capacitance layer provided between said common electrode and the group of discrete capacitance electrodes, wherein the corresponding electrodes in said group of discrete capacitance electrodes and the group of pixel electrodes being electrically connected to each other, and the capacitance layer is a dielectric ceramic layer or a transparent dielectric ceramic layer.

16. The self-emission type display device according to claim 5, wherein the luminescent layer is an organic electroluminescent layer.

17. The self-emission type image display device according to claim 6, wherein the capacitance layer or the transparent capacitance layer is a liquid crystal layer.

18. The self-emission type image display device according to claim 6, wherein the capacitance layer or the transparent capacitance layer is a dielectric ceramic layer or a transparent dielectric ceramic layer.

19. The self-emission type image display device according to claim 6, wherein the luminescent layer is an organic electroluminescent layer.

20. The self-emission type image display device according to claim 7, wherein the capacitance layer or the transparent capacitance layer is a liquid crystal layer.

21. The self-emission type image display device according to claim 7, wherein the capacitance layer or the transparent capacitance layer is a dielectric ceramic layer or a transparent dielectric ceramic layer.

22. The self-emission type image display device according to claim 7, wherein the luminescent layer is an organic electroluminescent layer.

23. The self-emission type image display device according to claim 8, wherein
the capacitance layer or the transparent capacitance layer is a liquid crystal layer.

24. The self-emission type image display device according to claim 8, wherein
the capacitance layer or the transparent capacitance layer is a dielectric ceramic layer or a transparent dielectric ceramic layer.

25. The self-emission type image display device according to claim 8, wherein
the luminescent layer is an organic electroluminescent layer.

26. The self-emission type image display device according to claim 9, wherein
the capacitance layer or the transparent capacitance layer is a liquid crystal layer.

27. The self-emission type image display device according to claim 9, wherein
the capacitance layer or the transparent capacitance layer is a dielectric ceramic layer or a transparent dielectric ceramic layer.

28. The self-emission type image display device according to claim 9, wherein
the luminescent layer is an organic electroluminescent layer.

29. The self-emission type image display device according to claim 10, wherein
the capacitance layer or the transparent capacitance layer is a liquid crystal layer.

30. The self-emission type image display device according to claim 10, wherein
the capacitance layer or the transparent capacitance layer is a dielectric ceramic layer or a transparent dielectric ceramic layer.

31. The self-emission type image display device according to claim 1, wherein
the luminescent layer is an organic electroluminescent layer.

32. A self-emission type image display device, comprising:
first and second pixel electrodes;
a luminescent layer positioned between said first and second pixel electrodes;
first and second capacitance electrodes;
a capacitance layer positioned between said first and second capacitance electrodes; and
a substrate; wherein
said luminescent layer, said first and second pixel electrodes, said capacitance layer, and said first and second capacitance electrodes are positioned along a line which is perpendicular to a surface of said substrate, and
said first capacitance electrode is electrically connected to said first pixel electrode to maintain the same potential across said first capacitance electrode and said first pixel electrode.

33. The self-emission type image display of claim 32, wherein
said capacitance layer is transparent.

34. The self-emission type image display of claim 32, wherein
said luminescent layer includes an organic electroluminescent material.

35. A self-emission type image display device, comprising:
a common electrode;
a pixel electrode;
a luminescent layer positioned between said pixel electrode and said common electrode;
a capacitance electrode;
a capacitance layer positioned between said capacitance electrode and said common electrode; and
a substrate; wherein
said luminescent layer, said pixel electrode, said capacitance layer, and said capacitance electrode are positioned to intersect a line which is perpendicular to a surface of said substrate, and
said capacitance electrode is electrically connected to said pixel electrode to maintain the same potential across said capacitance electrode and said luminescent electrode.

36. The self-emission type image display of claim 35, wherein
said capacitance layer is transparent.

37. The self-emission type image display of claim 35, wherein
said luminescent layer includes an organic electroluminescent material.

38. The self-emission type image display of claim 5, further comprising:
a group of driving elements, each associated with a corresponding transparent pixel electrode for driving said corresponding pixel electrode.

* * * * *